United States Patent [19]
Janko et al.

[11] Patent Number: 5,221,895
[45] Date of Patent: Jun. 22, 1993

[54] PROBE WITH MICROSTRIP TRANSMISSION LINES

[75] Inventors: Bozidar Janko, Portland; Valdis E. Garuts, Beaverton; J. Lynn Saunders, Hillsboro, all of Oreg.

[73] Assignee: Tektronix, Inc., Wilsonville, Oreg.

[21] Appl. No.: 811,855

[22] Filed: Dec. 23, 1991

[51] Int. Cl.⁵ .......................................... G01R 31/02
[52] U.S. Cl. ........................... 324/158 P; 324/158 F
[58] Field of Search ............. 324/158 R, 158 P, 72.5; 439/482; 333/246, 248

[56] References Cited

U.S. PATENT DOCUMENTS

| | | | |
|---|---|---|---|
| 4,574,235 | 3/1986 | Kelly et al. | 324/158 F |
| 4,764,723 | 8/1988 | Strid | 324/158 P |
| 4,891,585 | 1/1990 | Janko et al. | 324/158 P |
| 4,943,768 | 7/1990 | Niki et al. | 324/158 P |
| 5,061,854 | 10/1991 | Ikeda | 324/158 P |

Primary Examiner—Vinh Nguyen
Attorney, Agent, or Firm—John D. Winkelman; John Smith-Hill

[57] ABSTRACT

A probe for testing integrated circuits includes a stiff elastic substrate including a conductive plane, the substrate having a major portion with fingers projecting therefrom in cantilever fashion. A layer of dielectric material is adhered to the substrate and has a main surface remote from the substrate. A plurality of conductor runs are adhered to the layer of dielectric material at the main surface thereof. The conductor runs extend over at least some of the fingers and are configured to form transmission lines when the conductive plane is connected to a reference potential level.

27 Claims, 2 Drawing Sheets

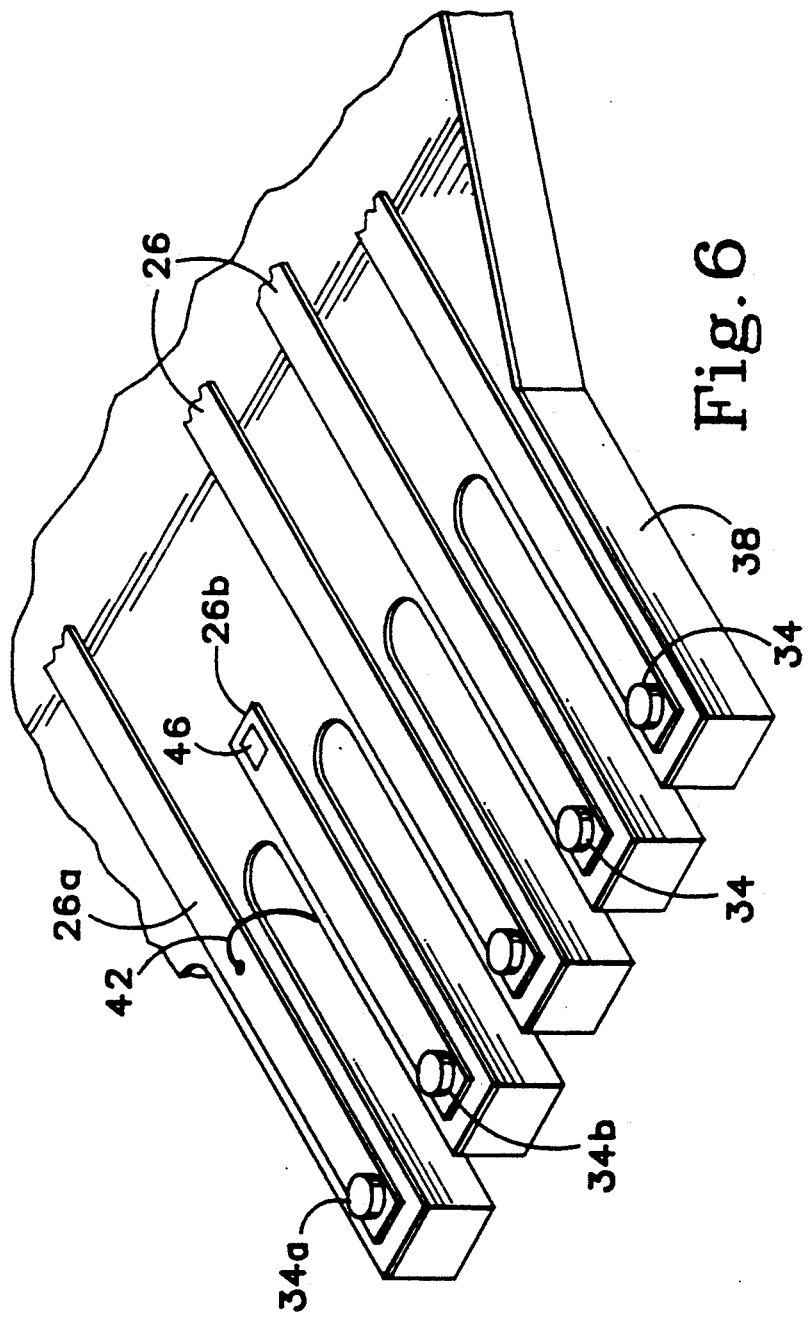

PROBE WITH MICROSTRIP TRANSMISSION LINES

BACKGROUND OF THE INVENTION

This invention relates to a probe having microstrip transmission lines.

An important aspect of the manufacture of integrated circuit chips is the testing of the circuit embodied in the chip in order to verify that it operates according to specification. Although the circuit could be tested after the chip has been packaged, the expense involved in dicing the wafer and packaging the individual chips makes it desirable to test the integrated circuit as early as possible in the fabrication process, so that unnecessary efforts will not be expended on faulty devices. It is therefore desirable that these circuits be tested either immediately after wafer fabrication is completed, and before separation into dies, or after dicing but before packaging. In either case, it is necessary to make electrical connection to all the circuit's external connection points (usually bonding pads) in a non-destructive way, so as not to interfere with subsequent packaging and connection operations.

Typical high-speed circuits are designed to operate with input and output signal bandwidths exceeding 1 GHz and to receive and transmit signals from and into transmission lines of predetermined characteristic impedance, typically 50 ohms. It is desirable that an integrated circuit be tested under its design operating conditions and to the extremes of its design performance range. This necessitates that high-speed circuits be tested at these high frequencies, which requires that transmission lines be employed to transmit signals into and receive signals from the circuits.

Typically, an integrated circuit is tested in a probe station by use of a test and measurement instrument that is connected to the device under test (DUT) by use of a probe. Probes that are currently commercially available comprise a substrate of insulating material and multiple conductive probe elements that are supported by the substrate. The probe elements are connected to the test and measurement instrument by coaxial cables. The probe elements have tips that are arranged in a pattern corresponding to the pattern of connection points of the DUT. The DUT is positioned in the probe station directly beneath the tips of the probe elements, and is raised to bring its connection points into contact with the tips of the probe elements.

When testing an integrated circuit, it is desirable that a good electrical connection be established between the probe elements and the connection pads of the device under test. In the event that the connection pads are gold, this requirement is generally met simply by achieving pressure contact between the connection pads and the tips of the probe elements, but if the connection pads are aluminum, it is generally necessary to penetrate a parasitic layer of aluminum oxide in order to establish a good electrically conductive connection.

An integrated circuit chip generally has many signal pads and several ground pads, and it is desirable that each ground pad be connected to a good ground at a location that is very close to the ground pad. Although the contact surfaces of the connection pads of an integrated circuit are nominally coplanar, it is necessary that a probe be able to accommodate minor departures from coplanarity.

Two types of probe that are currently commercially available are known respectively as wire probes and film probes. In a wire probe, the substrate is generally referred to as a probe card, and the probe elements are metal needles or wires that project in cantilever fashion from the probe card and are positioned with their tips in a pattern corresponding to the pattern of connection pads of the device under test.

When the device under test is raised into contact with the tips of the wires, the wires are deflected slightly and exert a scrubbing action relative to the connection pads. This ensures that any electrically insulating layer covering the connection pads is penetrated. Further, since the wires project in cantilever fashion from the probe card, their tips are deflectable independently of each other and therefore the wire probe is able to accommodate minor departures of the connection pads from coplanarity.

A disadvantage of the wire probe is that the ground element is connected to the ground plane at a point on the probe card, and therefore the ground connection cannot be any closer to the tip of the ground pad of the DUT than the length of the ground wire. Further, although the conductor runs and ground plane on the probe card form transmission lines that connect the signal elements to the external connectors, the transmission line environment ends at a distance from the device under test that is at least as great as the amount by which the probe elements project from the probe card. A further disadvantage of the wire probe is that it is necessary to use a mechanical positioner to assemble the probe, since the individual wires have to be positioned relative to each other and attached to the probe card, and use of a mechanical positioner results in the minimum spacing of the tips of the wires being rather high.

In a film probe, the substrate is a flexible film of electrically insulating material having conductor runs on one face and a ground plane on its other face. The probe elements are contact bumps that are formed directly on the conductor runs. The ground bump is connected to the ground plane through a via that interconnects the ground plane and the conductor run on which the ground bump is formed. The film probe is fabricated using photolithographic techniques, and therefore the contact bumps can be positioned with the same spacing and precision as the bonding pads of an integrated circuit.

In the film probe, the connection of the ground element to the ground plane can take place very close to the grounding pad of the DUT, and the transmission line environment can extend to a region that is very close to the connection pads of the device under test. However, the tips of the probe elements of the film probe are not able to move independently of each other to a significant extent, and therefore the film probe is not well suited to accommodate departures from coplanarity of the contact surfaces of the connection pads. Further, when the device under test is brought into contact with the tips of the probe elements of a conventional film probe, no appreciable scrubbing action takes place. Accordingly, although the film probe is electrically superior to the wire probe, the wire probe is mechanically superior to the film probe.

SUMMARY OF THE INVENTION

According to a first aspect of the present invention there is provided a probe comprising a stiff elastic substrate including a conductive plane, the substrate having a major portion with fingers projecting therefrom in cantilever fashion, and also having a main surface. A layer of dielectric material is adhered to the substrate at its main surface and has a main surface remote from the substrate. A plurality of conductor runs are adhered to the layer of dielectric material at the main surface thereof, the conductor runs extending over at least some of the fingers and being configured to form transmission lines when the conductive plane is connected to a reference potential level.

According to a second aspect of the present invention there is provided a method of fabricating a probe for use in testing an integrated circuit embodied in an integrated circuit chip, which method comprises providing a stiff elastic substrate including a conductive plane, the substrate having a major portion with a tip portion projecting therefrom, and also having a main surface. The method also comprises adhering a layer of dielectric material to the main surface of the substrate, the layer of dielectric material having a main surface remote from the substrate. A plurality of conductor run are formed on the layer of dielectric material at the main surface thereof, the conductor runs extending substantially parallel to one another over the tip portion of the substrate and being configured to form transmission lines when the conductive plane is connected to a reference potential level. The tip portion of the substrate is slit and the layer of dielectric material over the tip portion is slit, whereby fingers are formed that project from the major portion of the substrate in cantilever fashion and support respective conductor runs.

BRIEF DESCRIPTION OF THE DRAWING

For a better understanding of the invention, and to show how the same may be carried into effect, reference will now be made, by way of example, to the accompanying drawing in which:

FIG. 6 is a partial perspective view of a probe embodying the invention.

DETAILED DESCRIPTION

Figure 1:
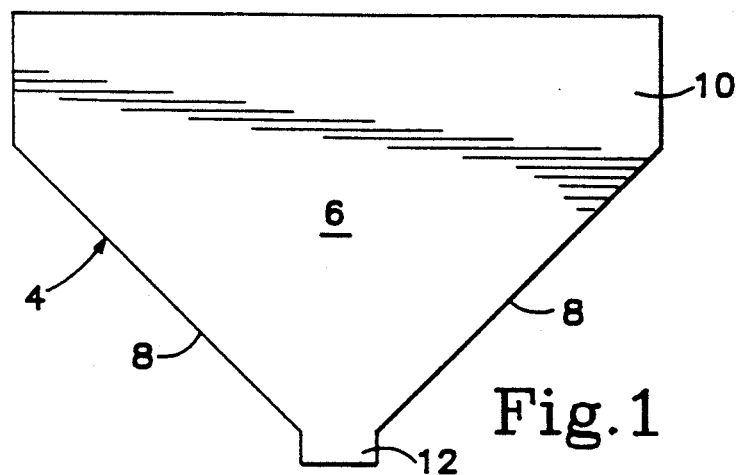
FIGS. 1-5 illustrate various steps during fabrication of a probe embodying the present invention, FIGS. 1 and 4 being plan views and FIGS. 2, 3 and 5 being sectional views.

FIG. 1 illustrates a substrate 4 of elastic metal having an upper main face 6 and a lower main face. In a preferred embodiment of the invention, the substrate is a beryllium copper alloy or spring steel. The substrate is generally triangular in form, having two edges 8 that converge from a support area 10 toward a generally rectangular tip area 12. The substrate is about 250 $\mu$m thick.

Figure 2:
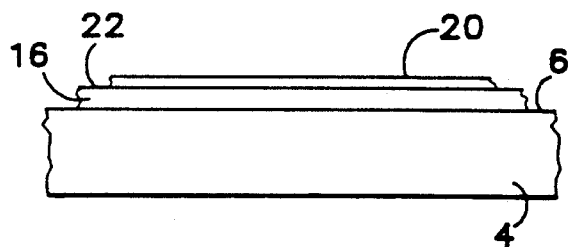

Referring to FIG. 2, a suitable insulating material such as polyimide is spun onto the upper main face 6 of the substrate 4 in the liquid phase and is then cured to form a layer 16 about 25 $\mu$m thick, and a layer 20 of gold is deposited over the upper main face 22 of the layer 16 using known metal deposition techniques.

Figure 3:
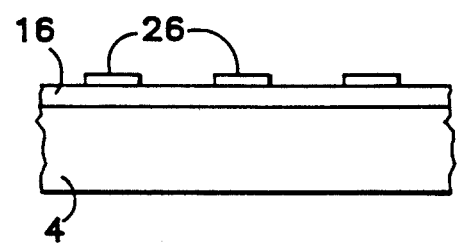

Referring to FIG. 3, the layer 20 is patterned using conventional photolithographic techniques to form conductor runs 26 that extend between the tip area 12 of the probe and the support area 10. The conductor runs are 50 $\mu$m wide, and consequently each conductor run in conjunction with the metal substrate 4, particularly the conductive plane at the upper main face thereof, forms a microstrip transmission line having a nominal characteristic impedance of 50 ohms. The conductor runs have a minimum spacing between centers of about 100-150 $\mu$m in the tip area of the substrate and fan out towards the support area, as shown in FIG. 4.

Figure 4:
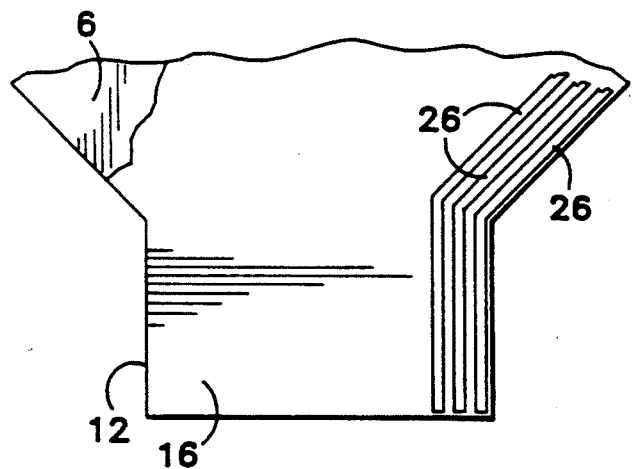
Figure 5:
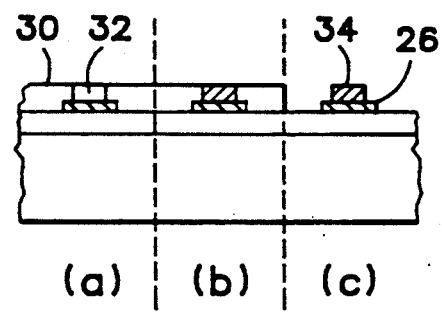

After the conductor runs have been formed, a layer 30 of photomask material (FIG. 5) is deposited over the upper surface of the structure shown in FIGS. 3 and 4, and holes 32 are formed in that layer over the distal end of each conductor run, as shown in portion (a) of FIG. 5. A hard contact metal, such as nickel, is deposited into these holes (FIG. 5, portion (b)), and the photomask material is then removed (FIG. 5, portion (c)). In this fashion, contact bumps 34 that stand proud of the conductor runs 26 are formed. The tip area 12 of the structure is then slit between each two adjacent conductor runs, whereby the tip area is divided into multiple separately flexible fingers 38 (FIG. 6) that project in cantilever fashion from the major portion of the substrate. The fingers are typically about 0.5 to 1 mm long and the space between the fingers is about one-half the distance between the centers of the conductor runs, i.e. about 50-75 $\mu$m.

The slitting of the tip area is preferably performed by ablation using an ultraviolet laser. An alternative would be to use a fine slurry saw, similar to the kind used for dicing semiconductor wafers. Use of ablation to slit the substrate imposes a limit of about 250 $\mu$m on the thickness of the substrate. Another possibility is to remove portions of the layer 16 that are between the conductor runs by etching and then slit the substrate using wire EDM (electrical discharge machining). Use of a slurry saw or EDM to slit the substrate allows a thicker substrate to be used.

The nickel bumps 34 serve as probe elements for contacting the connection points of a DUT. When the illustrated probe is in use, each nickel bump contacts one connection pad of the device under test. A bump 34a that is to contact a ground pad of the DUT is connected to the substrate by use of a bond wire 42 that is bonded to the conductor run 26a at the upper surface of the probe and passes between the fingers to the opposite side of the structure, where it is bonded to the substrate. Alternatively, as shown in relation to the bump 34b and the run 26b, a hole may be formed in the layer 16 before depositing the layer 20, so that the conductor run 26b is connected to the substrate by means of a via 46 formed in the hole. Of course, the hole and the eventual via may be formed over the tip area of the substrate instead of over the main portion. As also shown in relation to the conductor run 26b, the conductor run on which the ground bump is formed need not extend as far as the support area 10 of the substrate.

The elastic nature of the metal of the substrate ensures that when the DUT is brought into contact with the contact bumps, and is slightly overdriven, deflection of the fingers provides a desirable scrubbing action, and also supplies sufficient contact force for providing a reliable pressure contact between the contact bump and the connection pad of the DUT. It is generally necessary that a contact force of 1-10 grams force be produced at each contact bump, and in the case of a substrate of BeCu about 250 $\mu$m thick and fingers having the dimensions mentioned above, a contact force in this range is produced in response to a displacement of about 25 $\mu$m. An acceptable contact force can be obtained for the same displacement with a thinner or thicker substrate if the fingers are appropriately dimensioned.

The illustrated probe combines the superior electrical characteristics of the film probe with the superior mechanical characteristics of the wire probe. Thus, the microstrip transmission line environment extends all the way from the support area of the probe to the contact bumps on the tip area, and it is possible to connect the ground element 34a or 34b to a good ground very close to the ground pad of the DUT. Since the fingers are supported in cantilever fashion and are independently flexible, they accommodate minor departures of the contact surfaces of the connection pads from coplanarity and exhibit a scrubbing action when brought into contact with the connection pads of the DUT.

Use of photolithographic techniques in manufacture of the probe enables a higher density of probe elements to be achieved than in a wire probe. Further, the higher density of probe elements is generally obtainable at a lower cost than in a wire probe, where individual wires have to be positioned relative to each other and attached to the probe card.

It will be appreciated that the invention is not restricted to the particular embodiment that has been described, and that variations may be made therein without departing from the scope of the invention as defined in the appended claims and equivalents thereof. For example, the invention is not restricted to the particular materials that are employed in the probe described with reference to the drawings and other materials may be used instead. Thus, although the preferred material for the substrate is beryllium copper, which has an elastic modulus of about $130 \times 10^9$ N/m$^2$, other metals having a large elastic modulus, such as $100 \times 10^9$ N/m$^2$ or greater, for example stainless steel, may be used instead. Further, the invention is not limited to the substrate being metal, and a suitable substrate could be formed, for example, from a layer of stiff, elastic insulating material having a surface layer of conductive material. Similarly, although the preferred material for the layer 20 is gold, other metals, such as copper, may be used instead. In the preferred method of fabrication, the fingers are cut after formation of the conductor runs, but alternatively the substrate may be slit before applying the layers 16 and 20 and the dielectric material may be removed by a second ablation operation after patterning of the layer 20. The invention is not restricted to the layer of insulating material being spun onto the substrate, and an alternative would be to bond the insulating material in sheet form to the substrate.

We claim:

1. A probe for use in testing an integrated circuit embodied in an integrated circuit chip, comprising:
   a stiff substrate of elastic, conductive material, the substrate having a major portion with fingers projecting therefrom in cantilever fashion, and also having a main surface,
   a layer of dielectric material adhered to the substrate at its main surface and having a main surface remote from the substrate, and
   a plurality of conductor runs adhered to the layer of dielectric material at the main surface thereof, the conductor runs extending over at least some of the fingers and being configured to form transmission lines.

2. A probe according to claim 1, wherein said elastic material is a metal having an elastic modulus of at least about $100 \times 10^9$ N/m$^2$.

3. A probe according to claim 1, wherein the substrate has a thickness of about 250 μm and the layer of dielectric material has a thickness of about 25 μm.

4. A probe according to claim 1, wherein said conductor runs are configured to form microstrip transmission lines in conjunction with the substrate.

5. A probe for use in testing an integrated circuit embodied in an integrated circuit ship, comprising:
   a stiff elastic substrate including a conductive plane, the substrate having a major portion with fingers projecting therefrom in cantilever fashion, and also having a main surface,
   a layer of dielectric material adhered to the substrate at its main surface and having a main surface remote from the substrate, and
   a plurality of conductor runs adhered to the layer of dielectric material at the main surface thereof, the conductor runs extending over at least some of the fingers and being configured to form transmission lines and at least one of said conductor runs being connected to the conductive plane at a location that is substantially closer to the distal end of the conductor run than to the proximal end thereof.

6. A probe according to claim 5, comprising a bond wire connecting said one conductor run to the conductive plane of the substrate.

7. A probe according to claim 5, comprising a via connecting said one conductor run to the conductive plane.

8. A probe according to claim 5, wherein the substrate is an elastic metal.

9. A probe according to claim 8, wherein the elastic metal has an elastic modulus of at least about $100 \times 10^9$ N/m$^2$.

10. A probe according to claim 2, wherein the substrate is made of conductive material and the conductor runs are configured to form microstrip transmission lines in conjunction with the substrate.

11. A method of fabricating a probe for use in testing an integrated circuit embodied in an integrated circuit chip, said method comprising:
    providing a stiff substrate of elastic, conductive material, the substrate having a major portion with a tip portion projecting therefrom, and also having a main surface,
    adhering a layer of dielectric material to the main surface of the substrate, the layer of dielectric material having a main surface remote from the substrate,
    forming a plurality of conductor runs on the layer of dielectric material at the main surface thereof, the conductor runs extending substantially parallel to one another over said tip portion and being configured to form transmission lines, and
    slitting the tip portion of the substrate and slitting the layer of dielectric material over the tip portion, whereby fingers are formed that project from the major portion of the substrate in cantilever fashion and support respective conductor runs.

12. A method according to claim 11, wherein each conductor run has a distal end over the finger on which the conductor run is disposed and a proximal end spaced from the distal end, and the method further comprises connecting the conductive material to at least one of the conductor runs at a point that is substantially nearer the distal end of the conductor run than is the proximal end thereof.

13. A method according to claim 11, wherein each conductor run has a distal end over the finger on which the conductor run is disposed, and the method further comprises depositing a contact bump of a metal that is more wear resistant than the material of the conductor runs on the distal end of each conductor run.

14. A method according to claim 11, comprising slitting the tip portion of the substrate before adhering the layer of dielectric material to the main surface of the metal substrate.

15. A method according to claim 11, comprising slitting the tip portion of the substrate and the layer of dielectric material concurrently.

16. A probe for use in testing an integrated circuit embodied in an integrated circuit chip, comprising:
- a stiff substrate having a major portion with fingers projecting therefrom in cantilever fashion, said substrate being composed of a stiff plate of elastic, conductive material,
- a layer of insulating material adhered to the plate and having a main surface remote from the substrate, and
- a plurality of conductor runs adhered to the main surface of the layer of insulating material, the conductor runs extending over at least some of the fingers and being configured to form transmission lines.

17. A probe according to claim 16, wherein said elastic material is a metal having an elastic modulus of at least about $100 \times 10^9$ N/m$^2$.

18. A probe according to claim 16, wherein the substrate has a thickness of about 250 μm and the layer of dielectric material has a thickness of about 25 μm.

19. A probe according to claim 16, wherein said conductor runs are configured to form microstrip transmission lines in conjunction with the substrate.

20. A probe for use in testing an integrated circuit embodied in an integrated circuit chip, comprising:
- an elastic substrate comprising a stiff plate of an elastic metal, the plate having a main surface, said substrate having a major portion with fingers projecting therefrom in cantilever fashion,
- a layer of insulating material adhered to the plate at said main surface, and
- a plurality of conductor runs adhered to the layer of insulating material, the conductor runs extending over at least some of the fingers and being configured to form transmission lines, at least one conductor run being connected to the plate at a location that is substantially closer to the distal end of the conductor run that to the proximal end thereof.

21. A probe according to claim 20, comprising a bond wire connecting said one conductor run to the plate.

22. A probe according to claim 20, comprising a via connecting said one conductor run to the plate.

23. A probe according to claim 20, wherein the substrate the conductor runs are configured to form microstrip transmission lines in conjunction with the substrate.

24. A method of fabricating a probe for use in testing an integrated circuit embodied in an integrated circuit chip, said method comprising:
- providing a stiff substrate having a major portion with a tip portion projecting therefrom, said substrate being composed of a stiff plate of elastic, conductive material,
- providing a layer of insulating material adhered to the plate and having a main surface remote from the substrate,
- forming a plurality of conductor runs on the main surface of the layer of insulating material, the conductor runs extending substantially parallel to one another over said tip portion and being configured to form transmission lines, and
- slitting the tip portion of the substrate, whereby fingers are formed that project from the major portion of the substrate in cantilever fashion and support respective conductor runs.

25. A method according to claim 24, wherein said conductive material is a metal and the step of forming the conductor runs comprises adhering the conductor runs to the layer of insulating material.

26. A method according to claim 25, wherein each conductor run has a distal end over the finger on which the conductor run is disposed and a proximal end spaced from the distal end, and the method further comprises connecting the plate to at least one of the conductor runs at a point that is substantially nearer the distal end of the conductor run than is the proximal end thereof.

27. A method according to claim 25, comprising slitting the tip portion of the plate before adhering the layer of insulating material to the main surface of the plate.

* * * * *